Sept. 10, 1968 F. K. BECKER 3,401,359

TRANSISTOR SWITCHING MODULATORS AND DEMODULATORS

Filed March 4, 1966

INVENTOR
F. K. BECKER
BY J. P. Kearns
ATTORNEY

United States Patent Office 3,401,359
Patented Sept. 10, 1968

3,401,359

TRANSISTOR SWITCHING MODULATORS AND DEMODULATORS

Floyd K. Becker, Colts Neck, N.J., assignor to Bell Telephone Laboratories, Incorporated, New York, N.Y., a corporation of New York Filed Mar. 4, 1966, Ser. No. 531,935
11 Claims. (Cl. 332—16)

This invention relates to signal modulators of the switching type, and also to modifications thereof operable as transmission gates.

Modulators find applications in a large variety of data transmission terminal apparatus. These applications include modulation and demodulation in subcarrier and voice-band systems, phase comparison in phase-locked oscillators and correlators. The desirability and advantages of reducing the size and cost of such equipment is obvious.

It is an object of this invention to reduce the size, cost and number of components in switching-type modulators and transmission gates.

It is a further object of this invention to simplify switching-type modulators using a solid-state device as the active element.

According to this invention, a balanced modulator is effected using a single switching transistor in an effective hybrid coil circuit including a center-tapped inductor shunting a resistor bridging a signal source to a load circuit. The switching transistor grounds the center tap of the inductor when it is switched on by a switching input such as a carrier wave source. The inductor preferably has a high impedance at the frequency of the signal energy and the bridging resistor has twice the resistance of either of the signal source and load. Under this condition there exists a signal inversion between the source and load as the transistor switch is opened and closed. This is necessary and sufficient for balanced modulation of the signal frequency onto the switching carrier frequency, with the carrier frequency being suppressed. According to this invention the solid-state switching device may be a transistor of the junction or field-effect type.

Further according to this invention, a transmission gate may be effected by modifying the hybrid circuit just described to include a balancing resistor at half the value of either the signal source or load resistance in shunt or in series with the switching transistor. If this additional resistor shunts the switching transistor, there is transmission between the source and load only when the switch is closed. If the additional resistor is in series with the switching transistor, there is transmission between the source and load only when the switch is open.

It is a feature of this invention that the ratio between the signal and load voltages is determined solely by the resistances in the circuit and is the same regardless of the state of the switch.

It is another feature of this invention that a double-balanced modulator can be instrumented with a single switching element.

Other objects and features of this invention will become apparent from a consideration of the following detailed description of its several embodiments and the drawing in which.

Figure 1:
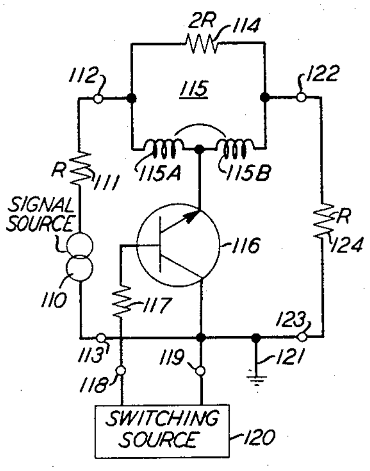
FIG. 1 is a circuit diagram of a modulator according to this invention using a junction transistor.

An illustrative embodiment of a switching modulator according to this invention is shown in FIG. 1. This modulator comprises a bridging resistor 114, a center-tapped inductor 115 having matched, mutually coupled sections 115A and 115B, junction transistor 116 having its emitter electrode connected to the center tap of inductor 115, a pair of input terminals 112–113 and a pair of output terminals 122–123. Terminals 113 and 123 are connected in common to a ground reference point 121. The collector electrode of transistor 116, illustrated as the n-p-n type, is also connected to reference point 121. The modulator proper is therefore a four-pole network with a junction transistor as the active element.

Terminals 112–113 form the input to the modulator. A signal source 110, having an internal resistance 111 of value R, is connected across these input terminals. Signal source 110 may advantageously be a digital or analog data source of relatively low frequency, such as is compatible with the telephone voice band.

Terminals 122–123 form the output of the modulator. A load 124, also of value R matching that of signal source 110, is connected across these terminals. Load 124 may advantageously be a telephone transmission line, such as a subscriber pair. Operation of the modulator of FIG. 1 is optimum if bridging resistor 114 has the value 2R and the impedance of 115 is large with respect to 2R at the lowest frequency emitted by source 110.

Switching transistor 116 has a pair of input terminals 118–119. Terminal 119 is grounded at reference point 121 and terminal 118 is connected to the base electrode of transistor 116 through dropping resistor 117 to limit the current in the base circuit to a safe value. Switching source 120 is connected to terminals 118–119. Source 120 may advantageously constitute a carrier wave source at any convenient frequency required for modulation.

The operation of the switching modulator of FIG. 1 is as follows. When transistor 116 is biased to cut-off by source 120, there is an effective open circuit to ground 121 from the center tap of inductor 115. The voltage appearing across load 124 is then one-fourth the voltage across signal source 110 and in phase therewith as determined by the ratio of the resistance R of the load 124 to the sum of the values of resistors 111, 114 and 124, namely: 4R. The impedance of inductor 115 at the source frequencies is high enough to have negligible effect on the magnitude of the load voltage. When transistor 116 is biased at or near saturation by switching source 120, the center tap of inductor 115 is grounded. Sections 115A and 115B of inductor 115 have essentially unity coupling and then act as the primary and secondary windings of an autotransformer. The polarity of terminal 122 is therefore opposite to that at terminal 112, and the current through load 124 is opposite in phase to that of signal source 110. Since the impedance of inductor 115 is postulated as high with respect to any frequency from source 110, the current flowing in the circuit is determined by the total series resistance 4R of the circuit and the voltage across load 124 is one-fourth that across source 110 as before. Only the phase of the voltage across the load is reversed. For continuous operation the phase of the load voltage with respect to that of the signal source changes at the rate determined by the frequency of the output of switching source 120.

Since no bias sources are required in the modulator of FIG. 1, the circuit operates equally as well when transistor 116 is of the p-n-p type.

The circuit of FIG. 1 is useful as a balanced modulator as described above. The circuit is also useful as a demodulator if signal source 110 is replaced by a transmission line conveying a modulated wave. Then, load 124 may represent a signal receiver or data sink.

The circuit of FIG. 1 is further useful as a phase-reversal modulator by making signal source 110 a constant-frequency carrier source and switching source 120 a bipolar data source in an obvious manner.

Figure 2:
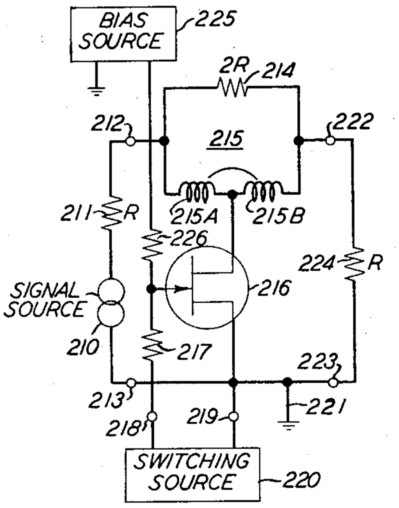
FIG. 2 is a circuit diagram of a modulator according to this invention using a field-effect transistor.

The modulator of FIG. 2 is of the same form as that of FIG. 1 with equivalent elements designated in the 200-series. The difference lies in substituting a field-effect transistor 216 in place of junction transistor 116.

The field-effect transistor, as is well known, comprises typically a central bar of one type semiconductor, such as n-type indicated in FIG. 2, having ohmic drain and source connections at the ends thereof and a peripheral band of opposite type semiconductor material to which a further ohmic connection called a gate is attached. The field-effect transistor operates according to the pinch effect wherein the gate is normally reverse biased to prevent electron current flow between source and drain. A forward bias on the gate electrode switches the field-effect transistor on. The field-effect transistor is characterized by higher input and output impedance than junction transistors. In fact, its characteristics more closely match those of pentode electron tubes. Its output resistance exhibits close to square-law variation with gate voltage. This circumstance renders its use in multiplying circuits of great value.

The circuit of FIG. 2 includes n-type field-effect transistor 216 with its source (lower) and drain (upper) electrodes connected between the center tap of inductor 215 and ground reference point 221. Negative bias source 225 supplies a bias current through resistor 226 to the gate electrode so that the transistor is normally cut-off. Switching source 220, having terminals 218 and 219, supplies a turn-on signal to the gate electrode through resistor 217. The remainder of the circuit is a direct counterpart of the circuit of FIG. 1. Because of the nonlinear resistance variation with change in gate voltage of the field-effect transistor, this circuit is particularly useful as a linear productor or multiplier. Its operation is substantially the same as that of FIG. 1. Width modulated pulses may be derived advantageously from switching source 220. In this event signal source 210 would be a constant frequency source.

Figure 3:
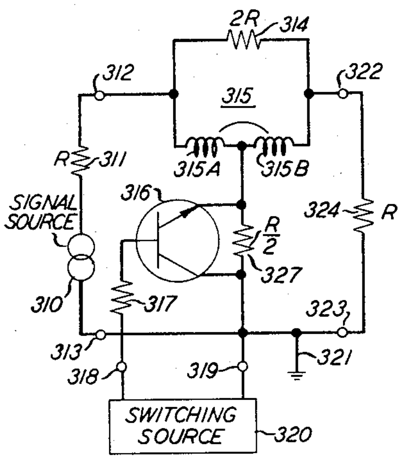
FIG. 3 is a circuit diagram of a balanced transmission gate according to this invention using a balancing resistor in shunt with a switching transistor of the junction type.
Figure 4:
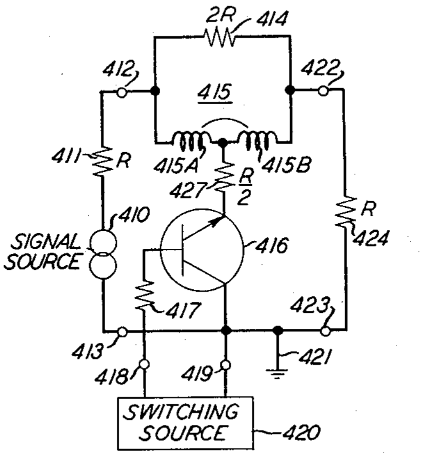
FIG. 4 is a circuit diagram of a balanced transmission gate according to this invention using a balancing resistor in series with a switching transistor of the junction type.

FIGS. 3 and 4 illustrate variations of the circuit of FIG. 1, which are useful as transmission gates. These circuits differ from that of FIG. 1 in having resistor 327 or 427 either in shunt of switching transistor 316 (FIG. 3) or in series with switching transistor 416 (FIG. 4). The value of resistors 327 and 427 is $R/2$, or one-half the value of the signal source resistors 311 and 411 and load resistors 324 and 424 in the respective FIGS. 3 and 4. Other elements in FIGS. 3 and 4 are comparable to those in FIG. 1 and are similarly designated by numbers in the 300 and 400 series. The respective circuits with transistor 316 open in FIG. 3 and with transistor 416 closed in FIG. 4 resolve themselves into the well known hybrid balancing circuit with the input circuits across terminals 312–313 and 412–413 being in conjugate relationship with the load circuits across terminals 322–323 and 422–423. By conjugate relationship is meant such a relationship that an input at terminals 312–313, for example, produces no output at terminals 322–323. The reverse is also true. Any input at terminals 312–313 appears only across bridging resistor 314 and balancing resistor 327. Due to the autotransformer action of coils 315A and 315B and the relationships among the resistors as shown in the figures the potential at terminal 322 is equal to that at the center tap of inductor 315 and no current flows in load 324.

On the other hand, when transistor 316 is on, the circuit of FIG. 3 is identical to that of FIG. 1 when transistor 116 is on. The voltage across load 324 is then one-fourth that of signal source 310 and of opposite phase. Thus, there is transmission from source to load in FIG. 3 when the transistor switch is closed and none when it is open.

The operation of the circuit of FIG. 4 is the reverse of that of FIG. 3 in that there is transmission from source 410 to load 424 when transistor 416 is open. The circuit of FIG. 4 is then the equivalent of that of FIG. 1 with transistor 116 open. Thus, the voltage across load 424 is in phase with that across signal source 410 and of one-fourth the value.

What is claimed is:

1. A switching circuit comprising a modulating signal source having a known internal resistance, a load circuit having a resistance matching that of said internal resistance, a center-tapped inductor interconnecting said source and said load, a bridging resistor at twice the value of either of said signal source or said load connected across said inductor, a solid-state switching device having its output and common electrodes connected between said center tap and a reference point shared with said signal source and load, an input electrode on said switching device, and a switching-wave source connected to said input electrode.

2. The switching circuit according to claim 1 in which said solid-state switching device is a junction transistor having an emitter as the output electrode, a collector as the common electrode, and a base as the input electrode.

3. The switching circuit according to claim 1 in which said solid-state switching device is a field-effect transistor having a drain as the output electrode, a source as the common electrode, and a gate as the input electrode said circuit further including a fixed source of reverse bias for said gate electrode.

4. The switching circuit according to claim 1 in which a balancing resistor at half the value of either of said signal source or said load is connected in shunt of the output and common electrodes of said solid-state device whereby to constitute said switching circuit a transmission gate.

5. The switching circuit according to claim 1 in which a balancing resistor at half the value of either of said signal source or said load is connected in tandem with the output and common electrodes of said solid-state device whereby to constitute said switching circuit a transmission gate.

6. The switching circuit according to claim 1 in which said signal source is a data intelligence source, said switching-wave source is a modulating carrier-wave oscillator and said load circuit is a transmission line.

7. The switching circuit according to claim 1 in which said signal source is a transmission line carrying a modulated wave intelligence signal, said switching-wave source is a demodulating carrier-wave oscillator and said load circuit is a data receiver.

8. The switching circuit according to claim 1 in which said signal source is a constant-frequency carrier-wave source, said switching-wave source is a bipolar data source and said load circuit is a transmission line, said switching circuit thus constituting a phase-reversal modulator.

9. In combination, a three-electrode solid-state switching device, a switching source connected across input and common electrodes of said device to control the opening and closing thereof, an intelligence signal source having a known internal resistance, An inductor of high impedance relative to said internal resistance and having a center tap connected to an output electrode of said device, a bridging resistor of twice said internal resistance shunted across said inductor, means connecting said signal source between one junction of said bridging resistor with said inductor and said common electrode, and a load circuit having a resistance equal to said internal resistance connected between the other junction of said bridging resistor with said inductor and said common electrode for accepting the products of waves from said switching and signal sources.

10. In combination, a three-electrode solid-state switching device, a switching source connected across said device to control the opening and closing thereof, an intelligence signal source having a known internal resistance, an inductor of high impedance relative to said internal resistance having a center tap connected to an output electrode of said device, a bridging resistor of twice said internal resistance shunted across said inductor, a balancing resistor of half said internal resistance in shunt of said common and output electrodes, means connecting said signal source between one junction of said bridging resistor with said inductor and said common electrode, and a load circuit having a resistance equal to said internal resistance connected between the other junction of said bridging resistor with said inductor and said common electrode for accepting signals from said signal source gated thereto by the closing of said switching source.

11. In combination, a three-electrode solid-state switching device, a switching source connected across input and common electrodes of said device to control the opening and closing thereof, an intelligence signal source having a known internal resistance, an inductor of high impedance relative to said internal resistance having a center tap connected to an output electrode of said device, a bridging resistor of twice said internal resistance shunted across said inductor, a balancing resistor of half said internal resistance in tandem between the center tap of said inductor and said output electrode, means connecting said signal source between one junction of said bridging resistor with said inductor and said common electrode, and a load circuit having a resistance equal to said internal resistance connected between the other junction of said bridging resistor with said inductor and said common electrode for accepting signals from said signal source gated thereto by the opening of said switching source.

References Cited

UNITED STATES PATENTS

| | | | |
|---|---|---|---|
| 1,254,118 | 1/1918 | Campbell | 179—81 |
| 2,982,868 | 5/1961 | Emile | 307—253 |
| 3,319,188 | 5/1967 | Brutsch | 325—105 |
| 3,327,133 | 6/1967 | Sickles | 307—340 X |

ALFRED L. BRODY, *Primary Examiner.*